United States Patent
Haimzon

(10) Patent No.: US 7,801,263 B2
(45) Date of Patent: Sep. 21, 2010

(54) CLOCK DIVIDER WITH A RATIONAL DIVISION FACTOR

(75) Inventor: Avi Haimzon, Givhatayim (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

(21) Appl. No.: 11/969,030

(22) Filed: Jan. 3, 2008

(65) Prior Publication Data

US 2008/0191749 A1 Aug. 14, 2008

Related U.S. Application Data

(60) Provisional application No. 60/889,471, filed on Feb. 12, 2007.

(51) Int. Cl.
H03K 23/00 (2006.01)
H03K 21/00 (2006.01)

(52) U.S. Cl. .......................................... 377/47; 377/48

(58) Field of Classification Search ........................ None
See application file for complete search history.

(56) References Cited

U.S. PATENT DOCUMENTS 5,365,119 A * 11/1994 Kivari ........................ 327/115
5,475,322 A * 12/1995 MacDonald ................. 326/93
5,552,732 A * 9/1996 Huang ........................ 327/116
6,696,870 B2 * 2/2004 Dellow ........................ 327/115
2005/0174153 A1 * 8/2005 Saeki ........................ 327/117

OTHER PUBLICATIONS

U.S. Appl. No. 11/876,526, filed Oct. 22, 2007 in the name of Ido Bourstein et al.
U.S. Appl. No. 11/093,080, filed Mar. 28, 2005 in the name of Eitan Rosen et al.
U.S. Appl. No. 10/614,403, filed Jul. 7, 2003 in the name of Eitan Rosen.

* cited by examiner

*Primary Examiner*—Tuan Lam

(57) ABSTRACT

This disclosure can provide methods, apparatus, and systems for dividing an input clock or master clock by an integer or non-integer divisor and generating one or more balanced, i.e., 50% duty cycle, divided that are phase-aligned to the input clock. The non-integer divisors can include half-integers, N/2, e.g. the division can be denoted 2:N. The value of N for each phase-aligned, balanced, divided clock can be distinct. The method can include generating an input clock signal having an input clock frequency, generating a secondary clock signal that transitions between a first state and a second state based on the input clock signal, generating a delayed secondary clock signal that is time delayed relative to the secondary clock signal, and generating the output clock signal that has a frequency that is a non-integer division of the input clock frequency.

21 Claims, 15 Drawing Sheets

US 7,801,263 B2

CLOCK DIVIDER WITH A RATIONAL DIVISION FACTOR

INCORPORATION BY REFERENCE

This application claims the benefit of U.S. Provisional Application No. 60/889,471, "Divide-by-2-N High Frequency Clock Circuit" filed on Feb. 12, 2007, which is incorporated in its entirety by reference herein.

BACKGROUND

Voltage controlled oscillators (VCOs) and phase lock loops (PLLs) are examples of clock generators that can produce digital clock signals for synchronous digital circuits. Digital clock signals, which are simply called clocks, can cause pattern noise or inter-symbol interference on digital lines if either the clock is imbalanced, the rise and fall times of the clock pulse edges are unequal, or both. Unbalanced clocks are clocks for which the duration of the high level signal is unequal to the duration of the low level signal. Balanced clocks have equal durations at both high and low levels, i.e., balanced clocks have 50% duty cycle.

Balanced clocks may be generated, for example, by taking a high frequency master clock that has a constant period and dividing by an integer. The integer is usually a power of two. Typically, generation of balanced divided clocks entails relatively complex analog circuit design and only a limited selection of output clock frequencies may be generated from any given master clock.

A clock divider formed of a standardized circuit block and which may be employed to generate multiple, balanced, phase-aligned, integer-divided output clocks is disclosed in the present assignee's co-pending U.S. patent application Ser. No. 11/876,526, "Apparatus and Method for Generating a Clock Signal," filed Oct. 22, 2007, the disclosure of which is incorporated by reference in it's entirety.

SUMMARY

This disclosure can provide methods, apparatus, and systems for dividing an input clock or master clock by an integer or non-integer divisor and generating one or more balanced, i.e., 50% duty cycle, divided clocks that are phase-aligned to the input clock. The non-integer divisors can include half-integers, N/2, e.g., the division can be denoted 2:N. The value of N for each phase-aligned, balanced, divided clock can be distinct. The method can include generating an input clock signal having an input clock frequency, generating a secondary clock-signal that transitions between a first state and a second state based on the input clock signal, generating a delayed secondary clock signal that is time delayed relative to the secondary clock signal, and generating the output clock signal that has a frequency that is a non-integer division of the input clock frequency.

The frequency of the input clock or master clock can be either pre-determined or measured and a reciprocal of the pre-determined or measured frequency can be used to determine the period of the input clock signal. The frequency of the input clock signal can be a fundamental frequency that is measured from a phase difference between a first and a second delayed input clock signal. The second delayed input clock signal can be delayed relative to the first delayed input clock signal by nearly the same delay as the first delayed input clock signal relative to the input clock signal. The delay of the second delayed input clock signal can be adjusted based on the frequency of the input clock signal so the delay can be less than one period of the input clock signal. The resulting balanced output clock signal can have delay of less than one quarter of a period relative to the input clock signal.

The methods, apparatus, and systems of this disclosure can make use of a device for generating a clock signal, such as the device and method for flexibly generating a balanced or an unbalanced divided clock signal as disclosed in U.S. patent application Ser. No. 11/876,526. The devices and systems of the present disclosure can include a measurement unit that determines the period of the input clock signal when the period is unknowns, i.e. not pre-determined. The input clock signal can have two edges per period.

The pattern generator and pattern selector of U.S. patent application Ser. No. 11/876,526 can implement a secondary clock synthesizer that generates a secondary clock signal that is phase-aligned to the input or master clock. This disclosure can include a shift actuator and a balancer that generates a delay of the secondary clock and a balanced output clock, respectively. The shift actuator can generate a delayed secondary clock signal by delaying the secondary clock signal by nearly one-quarter of the period. The balancer can, for example, generate a balanced output clock signal by logically ORing a suitably designed secondary clock signal and the delayed secondary clock signal. The secondary clock signal structure and logic gate type and circuit topology can match in a manner that generates a balanced, phase-aligned divided output clock.

The measurement unit, which can improve the precision of the balance when the input clock frequency is unknown, can determine the period by measuring the frequency of the input clock signal and determining the reciprocal of the measured frequency. The measurement unit can measure the frequency of the input clock signal by measuring a phase difference between two delayed input clock signals. Two measurement shifters can delay the input clock signal to generate the two delayed input clock signals.

The measurement unit can include a frequency/phase detector that can detect a phase difference between the two delayed input clock signals and a decode logic control unit that can generate a delay value based on the phase difference. The frequency/phase detector may be a Gilbert cell, an XOR gate, an UP/DOWN state machine, or a time-frequency detector, for example.

The measurement shifters can delay the input clock by a nearly constant group delay up to three times the reciprocal of the period of the input clock. The measurement shifters may be cascaded gate delays, Bessel filters, or transmission lines. Of the two delayed input clock signals from the measurement shifters the second delayed input clock signal can have the nearly the same delay relative to the first delayed input clock signal as the first delayed input clock signal has relative to the input clock signal.

The balanced output clock signal generated by the disclosed device can have a typical delay relative to the input clock signal of one quarter of the period of the input clock signal.

The disclosure can further describe a device for generating a clock which can include a controller, a first delay element, a second delay element, a phase detector, a decode logic control,], a set of shifter delay elements, a multiplexer, an output gate, and the positive pattern generator, negative pattern generator, and pattern merger or pattern selector of U.S. patent application Ser. No. 11/876,556. The controller can initialize delays in delay elements of the measurement unlit. The delay elements can generate delayed clock signals form an input clock signal, which has a constant period, a rising, and a failing edge in each period. The second of the two delay elements can delay the first delayed clock signal to generate the second delayed clock. A phase detector can be coupled to the delay elements to detect the phase difference between the first and second delayed input clock signals. The decode logic control unit can generate a delay value based on the phase difference between the two delayed clock signals.

The disclosed device can include the positive and negative pattern generators that were discussed in U.S. patent application Ser. No. 11/876,526. The positive pattern generator can create the positive clock pattern from the rising edge of the input clock and the negative pattern generator can create the negative clock pattern from the falling edge of the input clock. The pattern merger or pattern selector can interleave transitions of the positive edge clock and the negative edge clock to form the secondary clock.

The secondary clock by can be delayed by a plurality of shifter delay elements. Each shifter delay element can impose a distinct, predetermined delay A multiplexer can select a delayed secondary clock signal from the delayed signal from the plurality of shifter delay elements. The multiplexer can generate the delayed secondary clock signal based the delay value from the decode logic control. The secondary clock and the selected delayed secondary clock can be combined by the output gate to form the output clock.

BRIEF DESCRIPTION OF THE DRAWINGS

The disclosure will make reference to the accompanying figures, wherein like numerals represent like elements, and wherein.

DETAILED DESCRIPTION OF EMBODIMENTS

Figure 1:
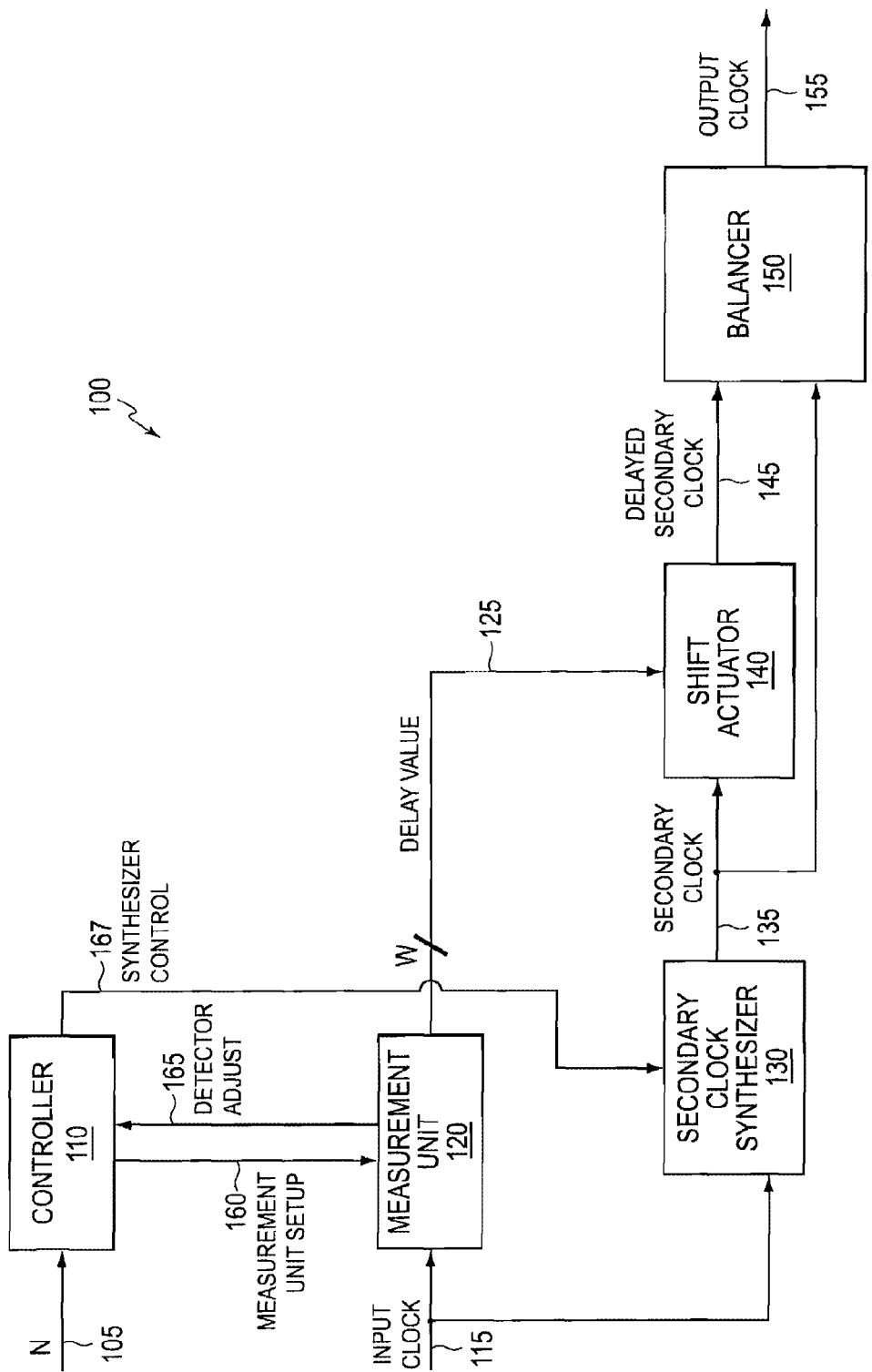
FIG. 1 shows an example of a rational clock divider for generating a balanced output clock that divides an input clock by a rational divisor, N/2.

FIG. 1 shows an example rational clock divider 100 for generating a balanced output clock that divides the frequency or clock rate of an input clock by a rational divisor. N/2. It should be noted that a conventional clock division ratio of N may be described as 1:N, i.e., one output clock cycle for N master clock cycles, where N is an integer. Using the conventional notation, the rational divisor N/2 that applies to the methods and apparatus of this disclosure can be denoted 2:N or 1:N/2. It should also be noted that a plurality of rational clock divider 100 may be implemented within a system, including a system on a chip (SOC). Each instance of rational clock divider 100 may divide a common master clock so that multiple, phase-aligned, balanced output clocks, possibly having distinct division factors, can be generated.

The rational clock divider 100 may contain a controller 110, a measurement unit 120, a secondary clock synthesizer 130, a shift actuator 140, and a balancer 150.

The controller 110 may accept a division factor input 105, N, and may provide a measurement unit setup signal 160 to the measurement unit 120. The controller 110 also may provide a synthesizer control signal 167 to the secondary clock synthesizer 130.

The measurement unit 120 may accept a measurement unit setup signal 160 and an input clock signal 115 and may output a delay value 125 to the shift actuator 140) and a detector adjust signal 165 to controller 110. The measurement unit may be bypassed if the period of the input clock signal 115 is known to high accuracy. Input clock signal 115 may also connect to the secondary clock synthesizer 130 and the secondary clock synthesizer 130 may connect to both the shift actuator 140 and the balancer 150. The balancer 150 may also accept a delayed secondary clock 145 from the shift actuator 140 and may output a balanced output clock 155 with a period of N/2 times the period of the input clock signal 115

If the input clock signal 115 and the output of the secondary clock synthesizer 130 are highly stable, i.e., have low phase noise, low Allen variance, low short-tert drift, etc., then the measurement unit 120 may be bypassed. If the input clock signal 115 and the output of the secondary clock synthesizer 130 have insufficient stability, i.e., have phase or frequency fluctuations above a pre-determined stability requirement, then measurement unit 120 can be used to determine which phase of the secondary clock synthesizer 130 will shift the secondary clock 145 signal by a commensurate amount so that a balanced output clock signal can be generated.

Input clock signal 115 may be a balanced or an unbalanced clock with a constant period. The input clock signal ITS may be a master clock that is distributed to subsystems on a chip or throughout a system. The input clock signal 115 may be provided by a system phase locked loop (PLL) and may be called a system clock or a clock reference.

Input clock signal 115 may have two edges per period, a rising edge and a falling edge, but may or may not have equal rise and fall times for each edge. The frequency of the input clock signal 115 may be measured from an, edge rate, a frequency, or from a phase difference between two or more delayed copies of input clock signal 115. The reciprocal of the fundamental frequency of the input clock signal 115 is the input clock period.

The measurement unit 120 may determine the period of the input clock signal 115 by approximating the reciprocal of the measured frequency. The period or a fraction of a period of input clock signal 111 may be encoded as a delay value 125 and sent to the shift actuator 140.

Delay value 125 may be sent from the measurement unit 120 to the shift actuator 140 as a digital word containing W bits, for example. The W bits may address or select one or more of a plurality of shifter or delay elements in the shift actuator 140. The W bits of delay value 125 may cause the shift actuator 140 to combine delay elements to achieve an aggregate delay. For example, delay value 125 may address a multiplexer in the shift actuator 140 and select a delay element from a plurality of delay elements that are electrically in parallel. Each delay element of the plurality of delay elements can receive a secondary clock 135 and can delay the secondary clock by a selectable delay.

In an embodiment of the disclosed material, the secondary clock 135 may be generated by triggering one transition of the secondary clock for each $N^{th}$ edge of the input clock signal 115 and another transition for each $((N-1)/2)^{th}$ edge after the first transition using devices and techniques, e.g., pattern generation and pattern selection, as shown and described in U.S. patent application Ser. No. 11/876,526, for example. A transition may be either a rising or a falling edge of a clock signal. The division factor input 105, i.e., N, may be received by the controller 110.

The controller 110 may setup the measurement unit 120 by selecting one or more measurement delays. The controller 110 may communicate the selection via measurement unit setup 160 and may receive a detector adjust signal 165 from the measurement unit 120. The selected measurement delay or delays may be a function of the division factor input 105. The measurement delay or delays may be less than the period of the input clock signal 105. A ¼ period delay may be suitable when the secondary clock is (N−1)/2 of the master clock, i.e., the input clock signal 115.

The controller 110 may also control the secondary clock synthesizer 130 via synthesizer control 167. Controller 110 may communicate the division factor input 105, or a clock rate divisor N/2, and control signals for selecting rising or falling edges of input clock signal 115 that trigger corresponding rising or falling transitions of the secondary clock signal 135. The controller 110 may also select the polarity of the transitions of the secondary clock signal 135. In other words, the edges of the input clock signal 105 may or may not have the same polarity as transitions of the secondary clock signal 135. Both the transition polarity and the rise and fall time of the secondary clock signal 135 may be determined by the secondary clock synthesizer 130.

The secondary clock synthesizer 130 may be described and embodied as disclosed in U.S. patent application Ser. No. 11/876,526. The secondary clock synthesizer 130 may, for example, include an inverter so the input clock signal 115 may be available in inverted and non-inverted versions for internal circuits. The internal circuits may be pattern generators and pattern selectors as described and embodied in U.S. patent application Ser. No. 11/876,526. The pattern generators may be either positive edge triggered or negative edge triggered by the input clock signal 115. The pattern selectors may be edge triggered or level triggered. For example, the pattern selector may be a multiplexer, as disclosed in U.S. patent application Ser. No. 11/876,526. Some embodiments of pattern generators may be positive edge triggered only but use an inverted input clock signal 115.

The secondary clock synthesizer 130 may, for example, contain counters or state machines that count edges of either input clock signal 115, and may count up or down to delay triggering on an edge of input clock signal 115. The counts may be periodically pre-loaded into the secondary clock synthesizer 130 by controller 110. The counts may correspond to trigger delays set by the division factor input 105. The delay triggering may allow an unequal number of edges to occur between consecutive secondary clock signal 135 transitions of the same polarity. For example, three input clock signal 115 edges may occur between a first pair of rising and falling transitions of secondary clock signal 135 and four edges may occur between a second pair of rising and falling transitions.

Table 1 shows example relations between the edges of input clock signal 115 and the transitions of secondary clock signal 135 for the cases of N=3, 5, 7, and 9. These examples correspond to division of the input clock signal 115 by 3/2, 5/2, 7/2, and 9/2, respectively. Table 1 shows examples for which there are two periods of the secondary clock signal 135 for each divisor, N/2. A hyphen in Table 1 denotes that a transition does not occur at the corresponding input clock edge.

TABLE 1

Division Factor Table, Phase 1

| Division Factor N | Input Clock Edge R = Rising F = Falling | Secondary Transition R = Rising F = Falling |
|---|---|---|
| 3 | R | R |
|   | F | F |
|   | R | — |
|   | F | R |
|   | R | F |
| 5 | R | R |
|   | F | — |
|   | R | F |
|   | F | — |
|   | R | — |
|   | F | R |
|   | R | — |
|   | F | F |
| 7 | R | R |
|   | F | — |
|   | R | — |
|   | F | F |
|   | R | — |
|   | F | — |
|   | R | — |
|   | F | R |
|   | R | — |
|   | F | — |
|   | R | F |
| 9 | R | R |
|   | F | — |
|   | R | — |
|   | F | — |
|   | R | F |
|   | F | — |
|   | R | — |
|   | F | — |
|   | R | — |
|   | F | R |
|   | R | — |
|   | F | — |
|   | R | — |
|   | F | F |

Table 1 shows a particular relationship between the input clock signal 115 and a secondary output clock 135. The relationship of edges to transitions may be permuted cyclically as shown in Table 2. There may be 2N cyclic permutations of input-to-secondary clock phasing. Table 2 shows possible phase permutations for the example of N=3 i.e., a divisor of 3/2. The cyclic permutations correspond to different allowed input-output phasing and transition polarities. Phase 1 of Table 2 corresponds to the topmost three entries of the Secondary column of Table 1 for N=3. A cyclic permutation table for N=5 could show ten phases with (N−1)/2=2 edges elapsing between transitions and (N+1)/2=3 edges elapsing between the next pair of transitions.

TABLE 2

Cyclic Permutation of Phase of Secondary Clock to Input Clock for N = 3

| Division Factor N | Input Edge R = Rising F = Falling | Phase 1 | Phase 2 | Phase 3 | Phase 4 | Phase 5 | Phase 6 |
|---|---|---|---|---|---|---|---|
| 3 | R | R | — | F | F | — | R |
|   | F | F | R | — | R | F | — |
|   | R | — | F | R | — | R | F |

The shift actuator 140 may delay the secondary clock signal 135 by a delay value 125 measured by the measurement unit 120. The delay value 125 may be an address or a set of address lines that route the secondary clock signal 135 through a selected delay element in the shift actuator 140. The delay element may be a single delay element or a cascade of delay units that cumulatively delay a secondary clock signal 135 by substantially one-quarter of a period of input clock signal 115. The output of the shift actuator 140 may be a delayed secondary clock 145 that is a delayed replica of secondary clock signal 135. The delayed secondary clock 145 may have substantially the same rise and fall characteristics as secondary clock signal 135. The delayed secondary clock 145 may have characteristics of a pure delay, i.e., constant group delay versus frequency, or may have approximately constant group delay over a bandwidth of several times the inverse of the period of the secondary clock signal 135. In other words, the shift actuator 140 may have some filter characteristics that slightly modify the line spectrum of the delayed secondary clock 145 relative to the secondary clock signal 135.

The secondary clock signal 135 and the delayed secondary clock signal 145 may both be processed by the balancer 150 to generate a balanced output clock 155. The balancer 150 may combine the secondary clock signal 135 and the delayed secondary clock signal 145 to generate a synthetic edge in balanced output clock 155. The synthetic edge may occur in the middle or near the midpoint of a period of input clock signal 115. The balancer 150 may use a logical OR gate, a logical NAND gate, logical AND gate or any other logic gate in combination with a suitable signal and a delayed signal, e.g., the secondary clock signal 135 and delayed secondary clock signal 145, to generate output clock 155, for example. The logical gate or gates can be balanced so the duty cycle of the output clock 155 is 50%. For example, a logical OR gate may extend the failing edge of output clock 155 to the latter of either the secondary clock signal 135 or the delayed secondary clock signal 145, thus generating a balanced output clock 155. A logical OR function can, for example, be implemented with two inverters and a NAND gate, as is known in the art.

The balancer 150 may both balance output clock signal 155 in a manner that equalizes the rise and fall times. The balancer 150 may use a pulse forming network, a high gain amplifier stage, a diode shaping network, a comparator with hysteresis or positive feedback, and the like. The balancer 150 may generate an output clock signal 155 that may be substantially 50% duty cycle when the secondary clock signal 135 and the delayed secondary clock signal 145 are suitably structured.

The output clock signal 155 from the balancer 150 may have a very small delay relative to the input clock signal 115. The input-to-output delay may be much smaller than one quarter of a period of input clock signal 115. The small input-to-output delay may occur when, nor example, either phase 1 or phase 5 of Table 2 is generated by the secondary clock synthesizer 130. Small input to output delays may occur for odd values of N when the minimally spaced transitions of secondary clock signal 135 have the same polarity as edges of input clock 115. Minimally spaced transitions may have (N−1)/2 edges between secondary clock, signal 145 transitions.

Figure 2:
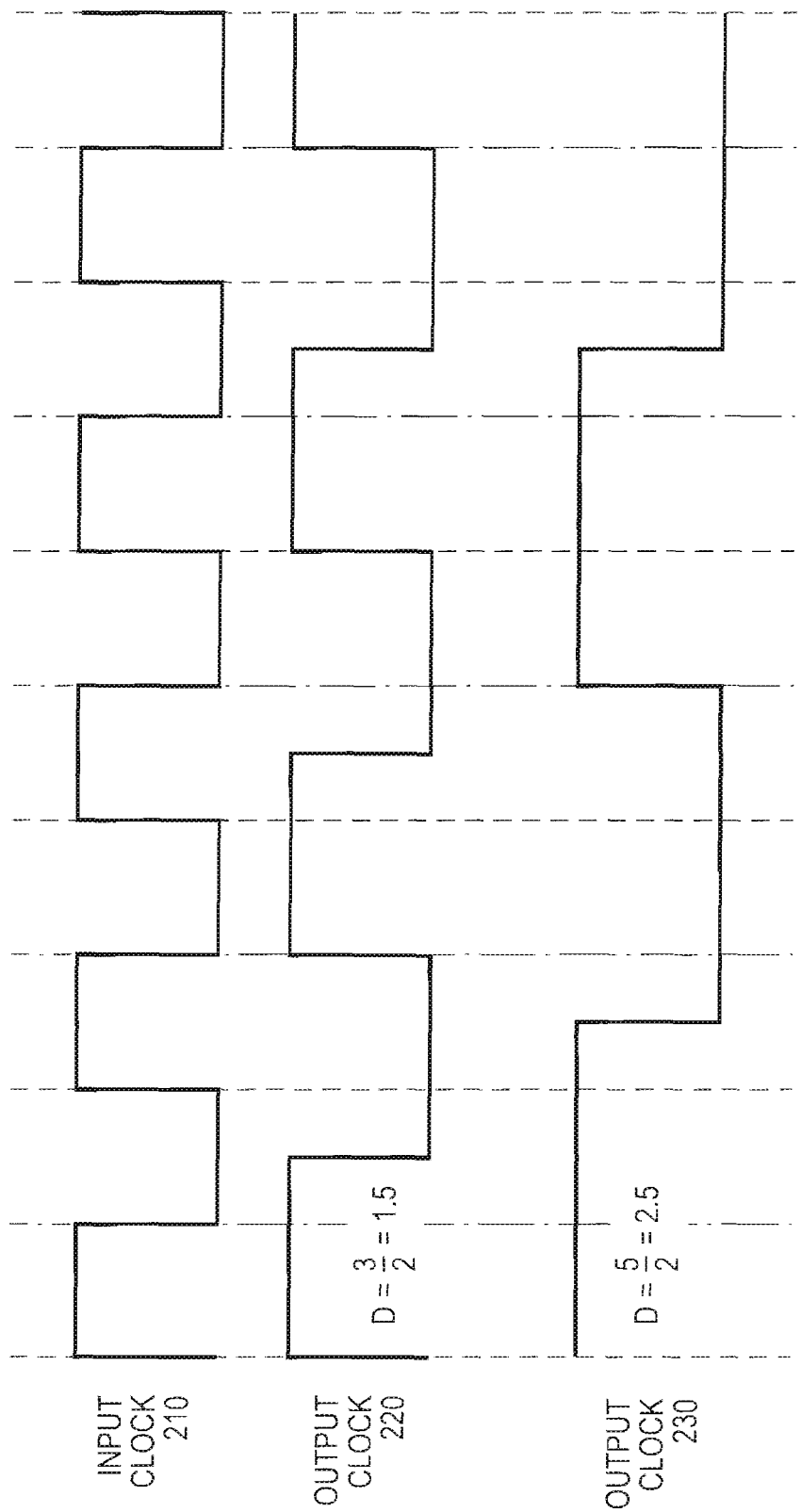
FIG. 2 shows an example of a timing diagram for an input clock, an output clock with a non-integer divided clock signal with a divisor D=3/2, and an output clock with a non-integer divided clock signal with a divisor D=5/2.

FIG. 2 shows an example timing diagram for an input clock signal 210, an output clock signal 220 generated with a divisor D=3/2, and an output clock signal 230 generated with a divisor D=5/2. The input clock signal 210 may be, for example, a master clock that is provided by a system PLL. The output clock signal 230 may be one of a plurality of phase-aligned output clock signals that may be desired from the master clock. Other phase-aligned output clock signals may use different divisors and may need to be delayed by different amounts than output clock signal 230.

Input clock signal 20 may provide a phase reference for clock signal 220 and clock signal 230. In this example, clock signal 220 has a division factor of N=3 and clock signal 230 has a division factor of N=5. Both clock signal 220 and clock signal 230 exhibit synthetic edges approximately midway between transitions of input clock signal 210. In these examples, the input-to-output delay for both output clock signal 220 and output clock signal 230 are much less than one quarter of the period of input clock signal 210.

As can be seen from FIG. 2, during operation of rational clock divider 100, output clock 220 and output clock 230 may each be generated by extending a falling transition of an unbalanced secondary clock signal by approximately one-quarter of the period of input clock 210. The unbalanced secondary clocks, the secondary and delayed secondary clocks, for example, that correspond to output clocks 220 and 230 may have a pulse width of an integral number of half cycles of the input clock 210. For example, the unbalanced secondary clock that corresponds to output clock 220 can be a logic ONE following a first rising edge of input clock 210 and can fall co-incident with the first failing edge of input clock 210 and can remain at a logic ZERO for two subsequent half cycles of input clock 210. The unbalanced secondary clock that corresponds to output clock 230 can be a logic ONE following a first rising edge of input clock 210 and can fall co-incident with the second rising edge of input clock 210 and can remain at a logic ZERO for three subsequent half cycles of input clock 210.

Figure 3A:
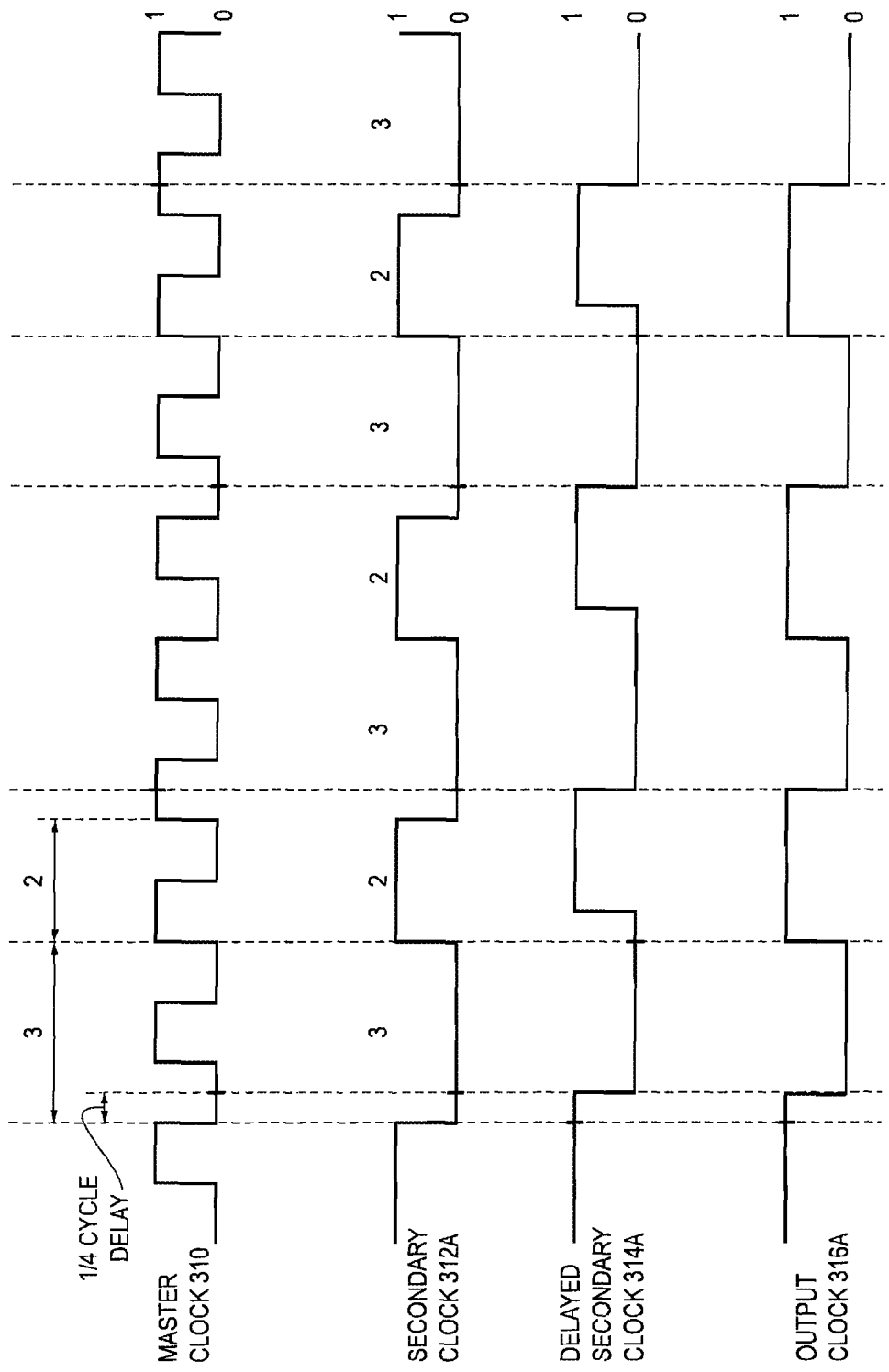
FIG. 3A-C shows an example of a timing diagram for secondary and delayed clocks with different logic combinations.

FIG. 3A is an example drawing showing a balanced. i.e., 50% duty cycle, master clock 310, a secondary clock signal 312, a delayed secondary clock signal 314, and an output clock signal 316. The secondary clock signal 312 may, for example, be produced by merging, selecting, or multiplexing two patterns, as described in U.S. application Ser. No. 11/876,526. Rising and falling edges of master clock 310 may be denoted with an R and an F, respectively. The transitions the secondary clock signal 312, the delayed secondary clock signal 314, and the output clock signal 316 may also be annotated with an R and an F to denote the corresponding nearest master clock signal 310 edge that they follow. The rise times and fall times of each signal may be shown as a small fraction of a period of the roaster clock 310 but may be an appreciable fraction of the period.

FIG. 3A shows a particular embodiment, however it should be understood that any method for producing suitable unbalanced signals may be employed. As shown in FIG. 3A, the secondary clock signal 312A may have an integral number of half cycles relative to the master clock 310. In general, a master clock 310, a set of instances of secondary clock signal 312A, and suitable delays for each secondary clock signal 312A can provide for multiple instances of phase-aligned, balanced output clock signal 316A on a chip or within a system, including a system on a chip (SOC). Each phase-aligned output clock may share a common phase reference with a master clock, such as master clock signal 310. Each example of a phase-aligned, balanced output clock may be generated by logically combining secondary and delayed secondary clock to produce an output clock with 50% duty cycle, regardless of the division factor. Phase-aligned signals may be described as coherent, i.e., sharing a common frequency or frequency multiple and repeating cyclically. When the division ratios are mutually prime, the period in which a set of signals repeats can be given by the master clock period times the division factors.

It should be noted that U.S. patent application Ser. No. 11/876,526 discloses flexible methods for producing clock-synchronous signals of any structure including balanced and unbalanced, e.g., having 2:3, 3:4, 4:5, patterns and the like.

The unbalanced secondary clock 312A may be generated by interleaving pattern generator signals, as disclosed in U.S. patent application Ser. No. 11/876,526. For odd values of N, the duty cycle for the unbalanced secondary clock 312A may be equal to (N−1)/(2N). In the example of N=5, the duty cycle may be 40%.

The delayed secondary clock signal 314A may be a delayed version of the unbalanced secondary clock 312A and the delay may be approximately one-quarter of the period of the balanced master clock 310.

The balanced output clock 316A may be obtained from a logical OR operation of unbalanced secondary clock 312A and the delayed secondary clock 314A. Alternative secondary clock signals for producing a balanced output clock 316 do exist. The alternative secondary clock signals can be generated by pattern generator, as provided for in U.S. application Ser. No. 11/876,526. The alternative secondary clock structures may be combined with different logic than a logical OR. For example, alternative secondary clock signals may be combined by a NAND gate, an AND gate, other combinational logic, and the like.

Using the disclosed methods and approach, output clock 316A can be a non-integer division of a master clock 310. Non-integer division factors can desirably raise the frequency of a balanced output clock 316. As an example, for an master clock 310 frequency of 500 MHz, the frequency of balanced output clock 316A may be 200 MHz instead of 167 MHz by using, a divisor of 2.5 rather than 3.

Figure 3B:
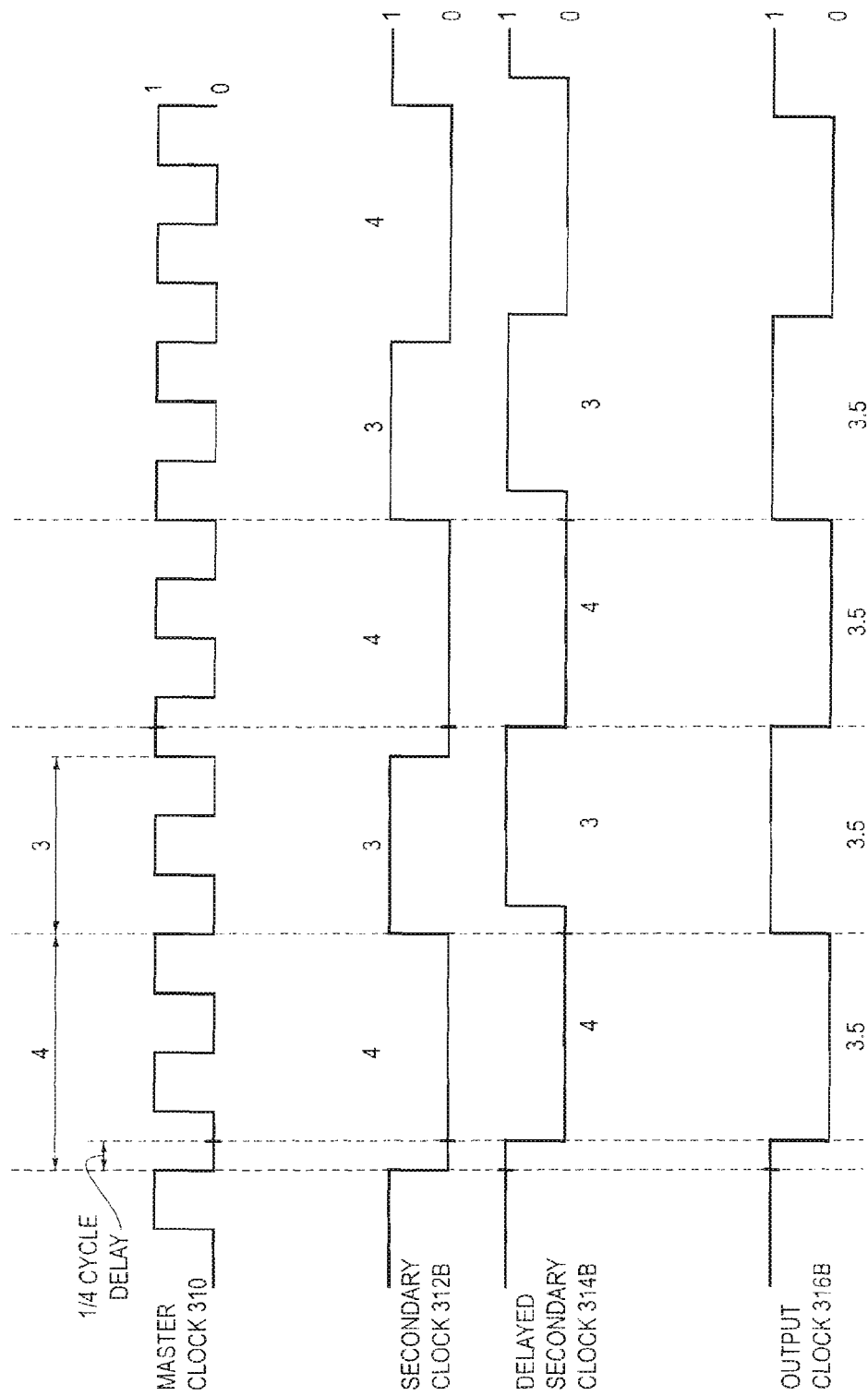
Figure 3C:
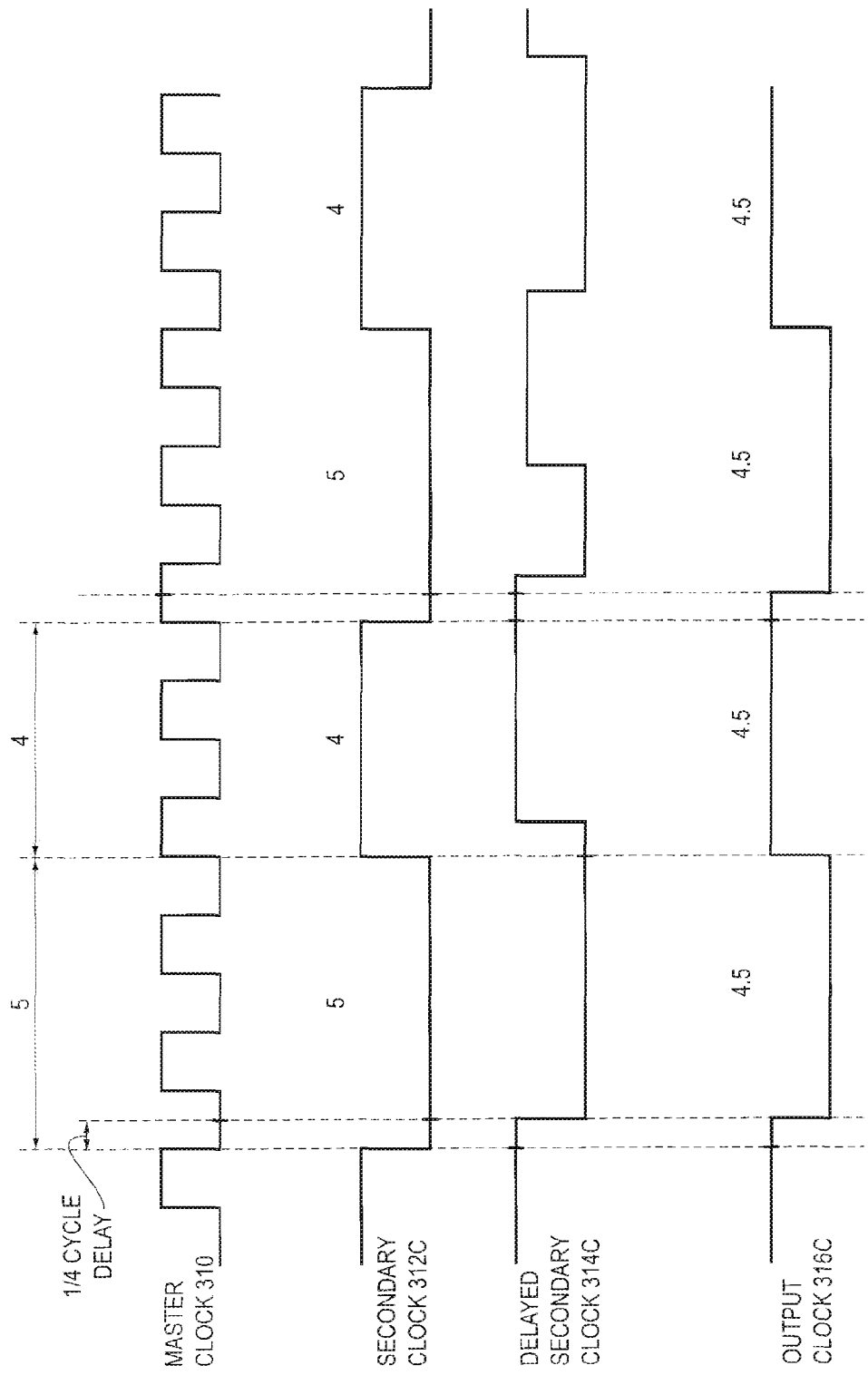

FIG. 3B and FIG. 3C show examples that produce 50% duty cycle divisions, e.g. 1:3.5 or 1:4.5, respectively. FIGS. 3B and 3C show the master clock signal 310, as shown in FIG. 3A, secondary clock signals 312B and 312C, delayed secondary clock signals 314B and 314C and output clock signals 316B and 316C, respectively. FIG. 3B and FIG. 3C are illustrative of the secondary clock signals that pertain to the use of an OR logic gate based balancer 150.

Figure 4:
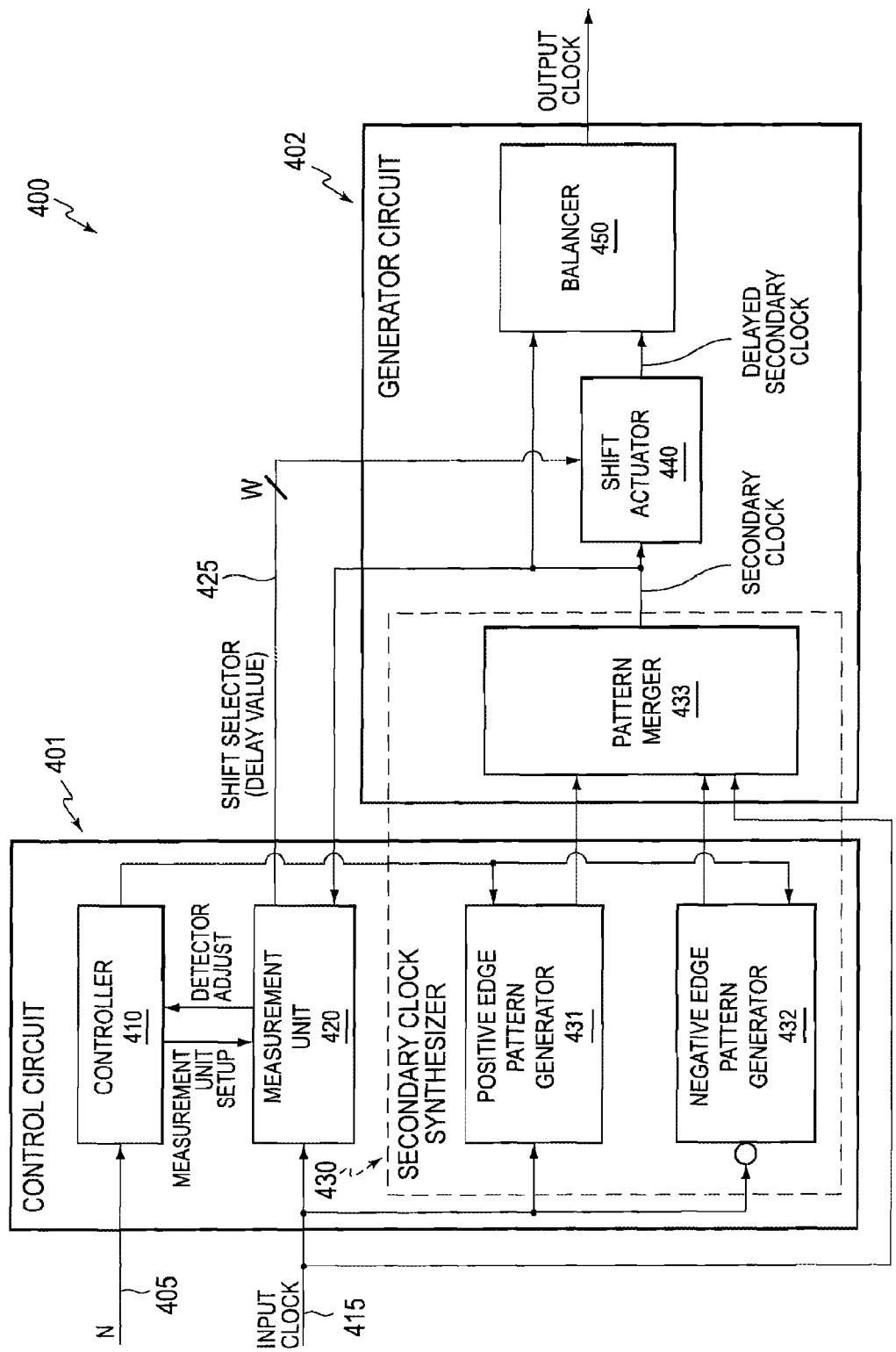
FIG. 4 shows an example of a control circuit and generator circuit for generating a balanced output clock from an input clock including a secondary clock synthesizer in accordance with Ser. No. 11/876,526.

FIG. 4 shows an example clock divider circuit 400 for generating a balanced output clock from an input clock. Clock divider circuit 400 may include a control circuit 401 and a generator circuit 402. The control circuit 401 may include a controller 410, a measurement unit 420, a positive edge pattern generator 431, and a negative edge pattern generator 432. The generator circuit 402 may include a pattern merger 433, a shift actuator 440, and a balancer 450. The positive edge pattern generator 431 and a negative edge pattern generator 432 can, for example, be embodiments of the synthesizer 430 and pattern selector disclosed in U.S. patent application Ser. No. 11/876,526.

The controller 410 may accept a division factor 405 equal to N and may provide a measurement unit setup signal to the measurement unlit 420 and may receive a detector adjust signal from measurement unit 420. The division factor 405 may be hard-wired the controller 410 or into pattern generation or other circuits. The controller 410 may also provide configuration signals to both the positive edge pattern generator 431 and the negative edge pattern generator 432.

The measurement unit 420 may supply a delay value 425 to the shift actuator 440. The measurement may be on a measurement of the input clock 415 or a secondary clock signal from the generator circuit 402. Measurement or the secondary clock signal may relax a requirement on the accuracy of the input clock 415.

The measurement unit 420 may produce a delay value 425 that can be a binary word including W bits. In an example, the delay value 425 can range from one to seven and can controls a multiplexer that selects one of seven shifters or delay elements. In an example, input clock 415 is 500 MHz and delay value 425 specifies a delay that is a multiple of approximately 125 picoseconds, i.e., ¼ of a cycle.

The positive and negative pattern generators 431 and 432 and the pattern merger that may be included in the generator circuit 402 may be combined into a secondary clock synthesizer 430 or these elements may be kept separate.

U.S. patent application Ser. No. 11/876,526 provides structures and methods of generating an unbalanced clock based on a balanced master clock. The positive and negative pattern generators 431 and 432, which may be embodiments of the previously disclosed structures, may, for example, include pre-settable counters and may receive configuration commands, such as court values, from controller 410. An embodiment that uses count values may divide the input clock 415 or an inverse by (N−1)/2 and (N−1)/2. The count values may cause positive and negative pattern generators 431 and 432 to trigger on selected edges of input clock 415 and an inverse, respectively. The inverse of input clock 41 may be generated by an inverter at the input of negative pattern generator 432, as indicated by an open circle in FIG. 4.

The positive and negative pattern generators 431 and 432 may, for example, provide both a positive edge pattern and a negative edge pattern to the generator circuit 402.

Generator circuit 402 may merge the positive edge pattern and the negative edge pattern from the control circuit 401 then delay the merged pattern or secondary clock signal and generate a balanced output clock from the secondary clock signal and the delayed secondary clock signal.

Pattern merger 433, which may be a multiplexer, for example, may combine or merge the positive edge pattern and the negative edge pattern in synchrony with the input clock 415. In other words, pattern merger 433 may, in phase alignment to the input or master clock, operate as a synchronous digital circuit. For example, pattern merger 433 may generate two consecutive transitions of the secondary clock in response. i.e. in synchrony with, two consecutive edges of the positive edge pattern then generate two consecutive transitions in response to two subsequent consecutive edges of the negative edge pattern. Pattern merger 433 may supply the merged pattern as a secondary clock signal to the balancer 450 and the shift actuator 440.

The shift actuator 440 may generate a time-delayed replica of the output of pattern merger 433. The shift actuator 440 may be an addressable delay element that can produce a ¼ cycle delay. The delay or shift may be selected by a delay value 425 from measurement unit 420. The time delay may be generated by delay elements having approximately constant group delay within the shift actuator 440. The delay elements within shift actuator 440 may be a selectable, parallel set of delays. Each of the parallel sets of delays can be further comprised of a serial arrangement of delay elements. A matrix addressable set of delay elements based on, for example and array of multiplexers, can be used to embody shift actuator 440. For each delay element or sub-element, a constant group delay may be a pure delay that does not modify the spectrum of the delayed signal. The group delay may, for example, be approximately constant, or flat, over a bandwidth greater than or equal several times the frequency of input clock 415. In an example, the delay may be generated by linear delay elements, such as cascaded multiplexers or delay non-linear delay elements that charge and discharge passive elements. The voltage across or current through the passive elements may trigger comparators that regenerate a delayed replica of the secondary clock signal or a delayed secondary clock. The delay elements may include cascaded multiplexers, cascaded gate delays, regenerators, Bessel filters, transmission lines, and the like.

The balancer 450 may process both the secondary clock signal and the delayed secondary clock signal to generate a balanced output clock 450. The balancer 450 may balance the output clock signal using feed-forward processing of one or more input signals without feedback adjustment of the period or duty cycle of the output clock signal. The balancer 450 may generate a balanced, i.e., 50% duty cycle, output that is a function of two suitable inputs, one of which is delayed relative to the other. A pair of inverters and a NAND gate can have the functionality of a logical OR gate as described with respect to the known art of FIG. 9. A logical OR gate can, for example, produce a balanced output clock 450 from a secondary clock and a delayed secondary clock, which may be denoted A and B, respectively.

Figure 5:
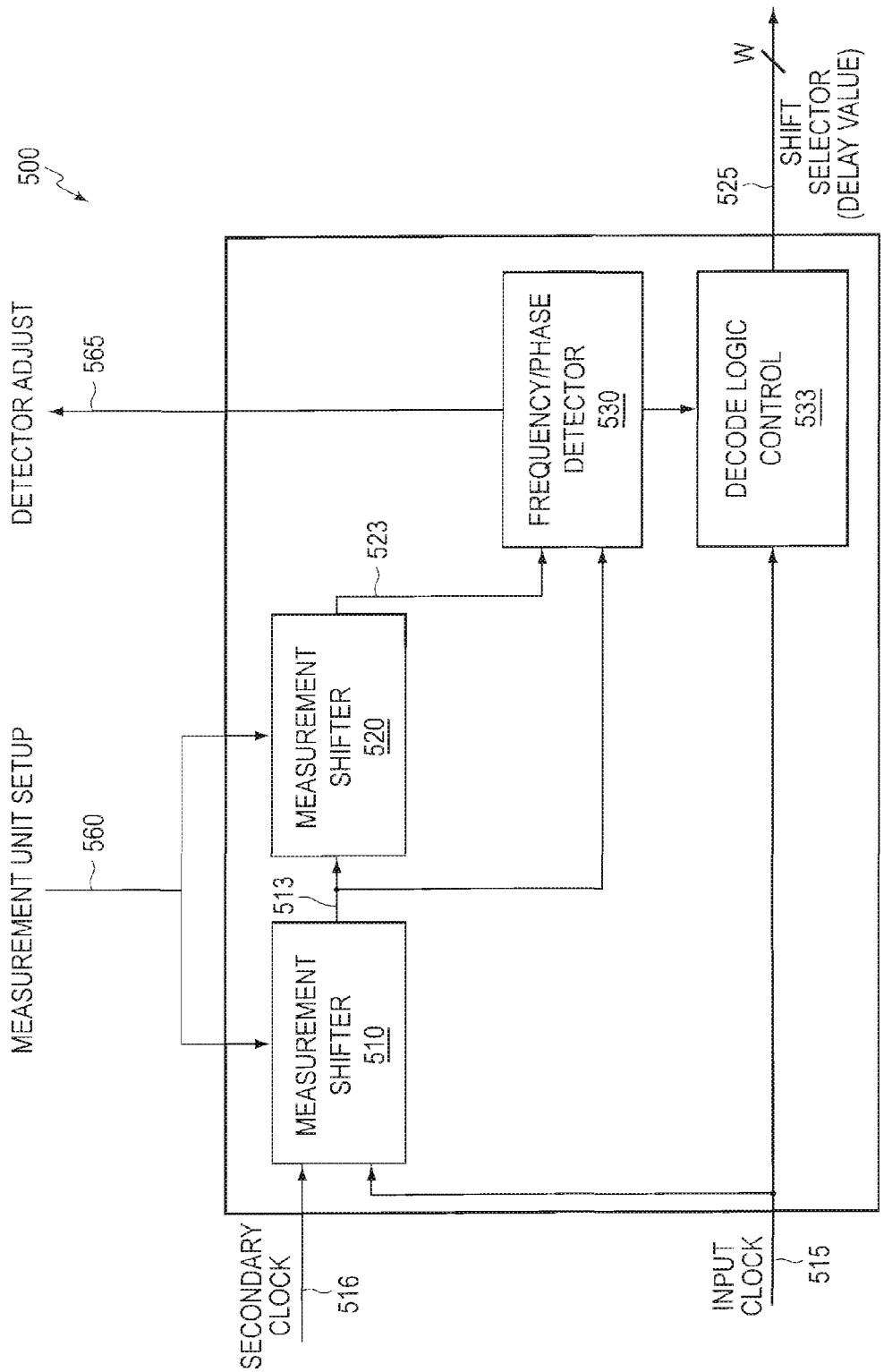
FIG. 5 shows an example of a measurement unit for measuring a shift selector or delay value for delaying an input clock.

FIG. 5 shows an example measurement unit 500 for measuring a shift selector or data value for delaying an input clock 515. The measurement unit 500 may be an embodiment, for example, of the measurement unit 120 or the measurement unit 420. The measurement unit 500 can include measurement shifter 510, measurement shifter 520, frequency/phase detector 530 and decode logic control 533.

Measurement shifter 510 and decode logic control 533 may each accept input clock 515 or a secondary clock 516, as determined by a measurement unit setup signal 560, such as measurement unit setup 160 of FIG. 1. Measurement shifter 510 may provide a first delayed input clock signal 513 to both measurement shifter 520 and to frequency phase detector 530. Measurement shifter 520 may provide a second delayed input clock signal 523 to frequency/phase detector 530. Both measurement shifters 510 and 520 may accept measurement unit setup or configuration information via measurement unit setup signal 560. The measurement unit setup information may differ for each measurement shifter. In an example, measurement shifters 510 and 520 may both receive setup information to delay their output signals with respect to their input signals by 250 picoseconds.

The output of frequency/phase detector 530 and input clock 515 may both connect to decode logic 533. Frequency/phase detector 530 may provide a measurement signal to decode logic 533 that is approximately proportional to the ratio of the delay of measurement shifter 520 and the period of input clock signal 515. Frequency/phase detector 530 may contain a frequency discriminator, a phase detector or both.

The frequency/phase detector 530 may determine the frequency of either delayed input clock signal 513 or 523 then change its phase detection function to report the phase difference between delayed input clock signal 513 and 523 without modulo-2π phase ambiguity. The frequency/phase detector 530 may report possible phase ambiguities to an external controller, such as either controller 110 or 410, via a detector adjust signal 565.

In an example, frequency/phase detector 530 may be a state machine containing reset-set (RS) flip-flops, a Gilbert cell, an XOR gate, an UP/DOWN state machine, a time-frequency detector, and the like, and may be followed by a charge pump and an integrator or low-pass filter. Additionally, frequency/phase detector 530 may generate one or more output signals, such as up/down signals that correspond to the frequency and phase error between the two delayed input clock signals 513 and 523. In an example, frequency/phase detector 530 may be a state machine, followed by a charge pump, and an integrator.

Decode logic control 533 may process a signal from phase/frequency detector 530 and an input clock signal 515 to produce a shift selector or delay value 525, denoted by W. Decode control logic 530 may include a pulse width analyzer, a comparator string, or an analog-to-digital converter (ADC), such as a flash ADC, a dual-slope ADC, and the like. Decode control logic 530 may also include a decoder, such as lookup table, a numerical division circuit, a Newton's method or CORDIC approximation to a division circuit, and the like, to determine or calculate a reciprocal of the measured frequency and generate a delay value 525, W. The delay value 525 may be a binary word, such as a three bit binary word that may select one of eight possible delay shift values in an adjustable clock delay element, such as shift actuators 140 or 440. The delay value 525 may be an ordered pair of row and column address words that select a set of serial or daisy-chained multiplexers, each of which has a finite input-to-output delay. The daisy-chained multiplexers can be arranged in a boustrophedonic array in which each multiplexer is fed from a common input, such as an input clock signal. As an example, the delay value 525 may be a decoded set of 8 row address lines and 8 column address lines. The row and column address may select which daisy-chained multiplexer first accepts the input signal to propagate to the end of the array and generate a delayed output, such as a delayed input clock signal.

The delay value 525 may delay the out put signal from a shift actuator by approximately one-quarter of a period of input clock signal 515. The delay value 525 may have a resolution of one thousandth to one fourth of the period of input clock 515. Changes in the delay value 525 may occur synchronously with respect to input clock 515. In other words, decode logic control 533 may be a clocked or synchronous logic circuit. Updates in the signal from frequency/phase detector 530 that reflect changes in the period of input clock 515 may appear in delay value 525 with minimum latency, such as a latency of one period, and may be aligned to a rising or falling transition of input clock signal 515.

Figure 6:
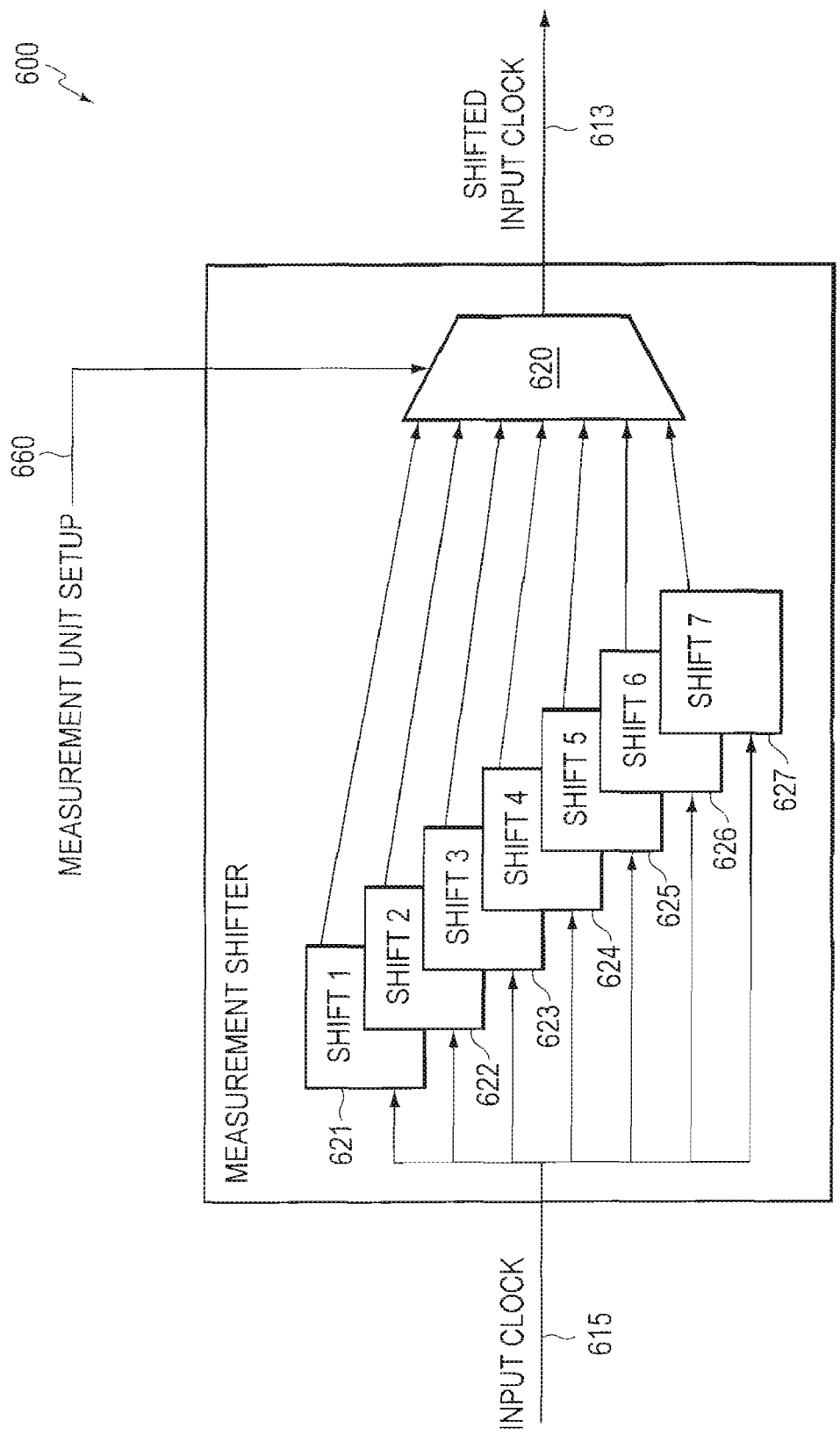
FIG. 6 shows an example of a measurement shifter that delays an input clock by a pre-selected value.

FIG. 6 shows an measurement shifter 600 for delaying an input clock by a pre-selected value. The measurement shifter 600 may, for example, embody measurement shifters 510 and 520. The measurement shifter 600 may accept an input clock 615, for example a master clock 115 or system PLL clock, a secondary clock, or another signal to be delayed and a measurement unit setup signal 660. The measurement shifter 600 can produce or output a shifted input clock 613. Measurement shifter 600 may contain a plurality of shifters, each shifter element 621-627 being a delay element or a phase change element. Measurement shifter 600 may also contain a multiplexer 620. As described with respect to FIG. 5, the measurement shifter 600 may include daisy-chained multiplexers. The multiplexers can be arranged in a boustrophedonic array with multiplexer fed from a common input. The row and column address, which may be given by the delay value 525, for example, may select which of the daisy-chained multiplexers first accepts and propagates the input signal that subsequently appears as the shifted input clock 613.

Multiplexer 620 may be controlled by a measurement unit setup signal 660 from a controller such as the controller 110. The measurement unit setup signal 660 may direct multiplexer 620 to select a shifter element to delay input clock 615 and so create a shifted input clock 613.

In an example, each shifter element 621-627 may delay a 500 MHz input clock 615 signal by a multiple of 125 picoseconds so the delay through shifter element 621 may be 125 picoseconds and the delay through shifter element 627 may be 875 picoseconds. Further, measurement shifter 600 may programmably configure delay elements in series so individual delays are daisy-chained into an aggregate delay larger than the delay of a single delay element. In this example, each shifter element 621-627 may be a combination of delay elements configured according to measurement unit setup signal 660. It should be understood by one of ordinary skill in the art that the measurement shifter 600 can be a parallel arrangement of addressable delay elements as shown in FIG. 6, a serial arrangement of delay elements with an selectable or addressable input point. In other words, measurement shifter 600 can be implemented by addressably varying either the feed-point, the take-out point, a combination of thereof; and like arrangements to implement a variable delay unit.

Figure 7:
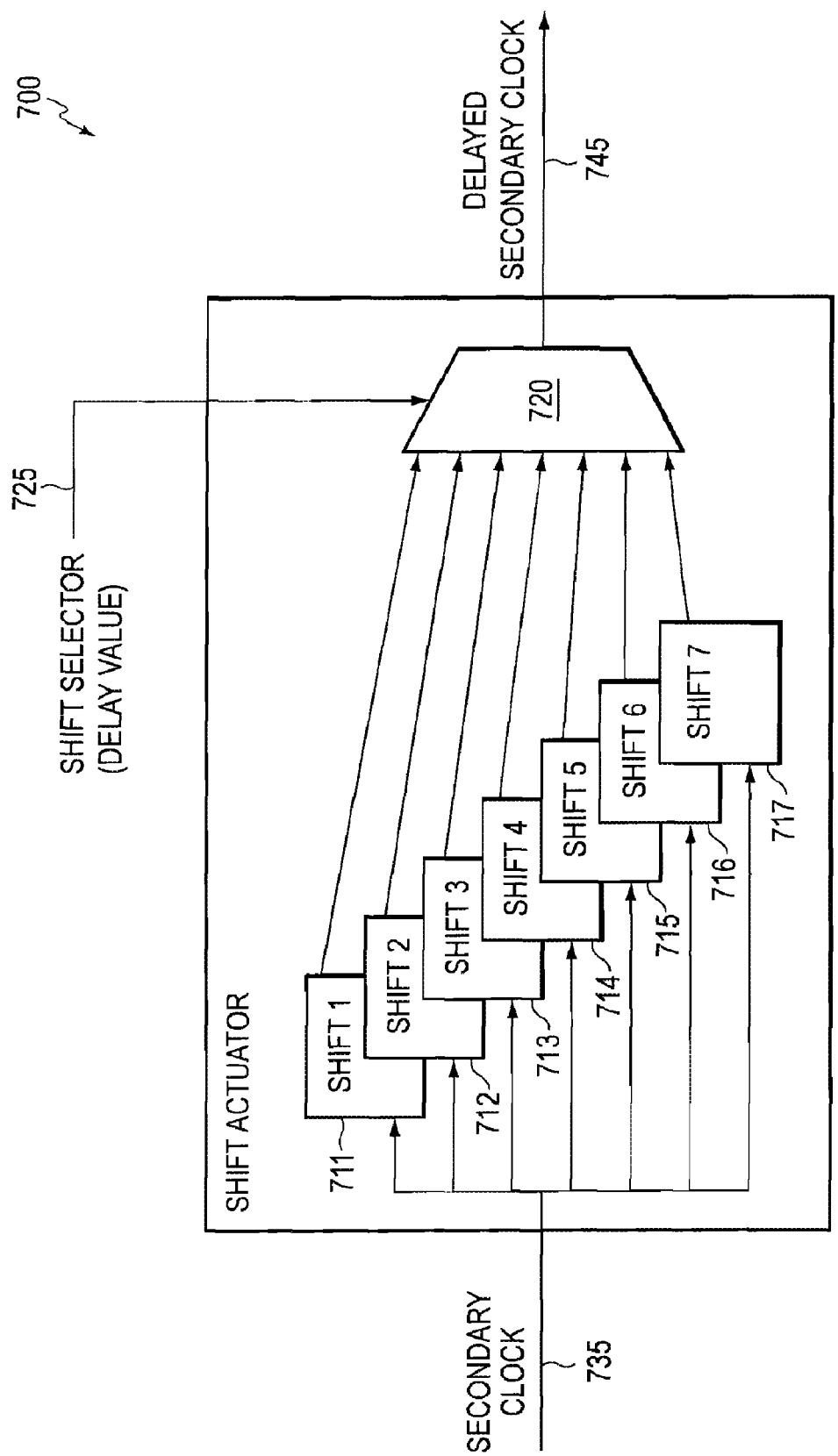
FIG. 7 shows an example of a shift actuator with a plurality of shift elements and a multiplexer.

FIG. 7 shows an example shift actuator 700 that contains a plurality of shift elements 711-717 and a multiplexer 720. The shift actuator 700 may, for example, be used to embody the shift actuator 140 and/or the shift actuator 440. The shift actuator 700 may, for example, also be the same type and design of addressable delay element as measurement shifter 600. The shift actuator 700 may accept a secondary clock signal 735 and a delay value 725 and may produce a delayed secondary clock signal 745 using multiplexer 720.

Multiplexer 720 may produce the delayed secondary clock 745 by delaying the secondary clock 735 using one or more of delay elements 711-717. Multiplexer 720 may address or select the delay element of elements according to delay value 725. The overall characteristics of the shift actuator 700 may be similar or identical to those of measurement shifter 600. In other words, the shift actuator 700 and the measurement shifter 600 may both use the same type of circuit and circuit layout. By replicating and reusing a delay circuit design, the shift waveform, and delay accuracy characteristics of the shift actuator 700 can match the characteristics of measurement shifter 600.

Figure 8:
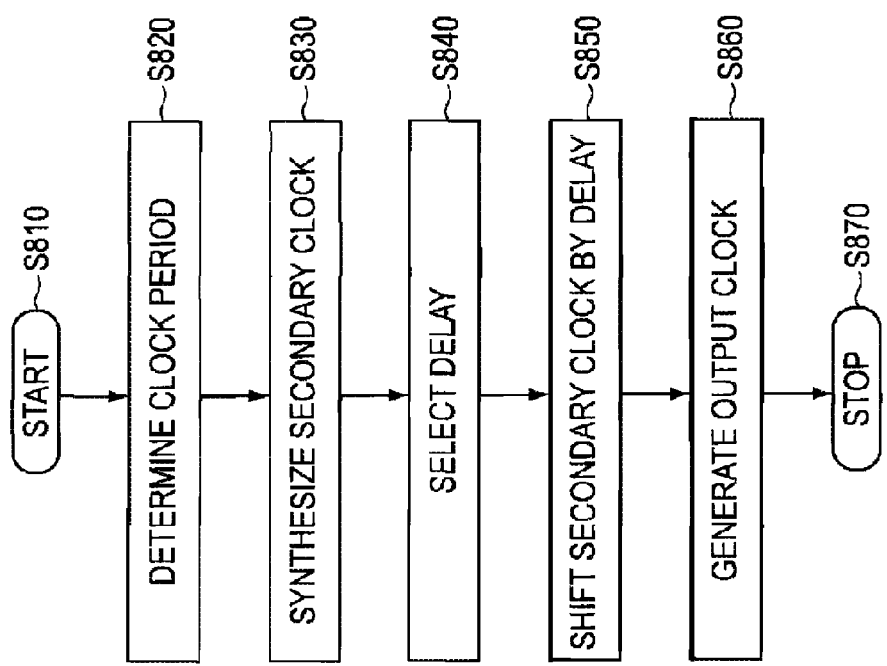
FIG. 8 shows an example of a flowchart of a process for rational clock division.

FIG. 8 shows a flowchart of an example process 800 for rational clock division. The program 800 may start at step S810 and proceed to step S820 in which the period of the input clock signal may be determined. The input clock signal may be pre-determined, in which case, program flow can proceed directly to step S830.

When the input clock or master clock period is unknown or inexactly known, then, for example, a measurement may produce a phase difference that is a ratio of a pre-determined delay and the input clock period. The input clock or master clock can be a clock from a system PLL. The period of the input clock may be determined from a reciprocal computed via a lookup table or a digital divider circuit. The digital divider circuit may use Newton's method or a co-ordinate rotation digital computer (CORDIC) type algorithm or other suitable method, for example.

In step S830, the program may synthesize an unbalanced secondary clock signal, for example using devices and methods described in U.S. patent application Ser. No. 11/876,526. The synthesis may produce an unbalanced secondary clock signal by alternately selecting, interleaving, or merging two or more clock patterns to produce a 2:3, 3:4, 4:5 cycle pattern, for example, as described in detail in U.S. patent application Ser. No. 11/876,526. Program flow can proceed from step S830 to S840.

In step S840, the program may select a delay value. The delay value may be an address, such as an ordered pair of row and column addresses, for example, of a delay element in a shift actuator such as shift actuator 140 or 440, that provides a desired delay. The delay value may delay an unbalanced secondary clock signal by approximately one-quarter of the period of the input clock signal. In an example, the delay value may delay a unbalanced secondary clock by approximately ¼ of the period of a master clock. After step S840, program flow may proceed to step S850.

in step S850, the secondary clock signal may be delayed by approximately the delay value selected in step S840. The delay value may be approximately one-quarter of a period of an input or master clock. In an embodiment, the delay can be a pure delay with group delay distortion that is less than one quarter of the period of the input clock signal over a bandwidth tip to several times the input clock frequency. After step S850, program flow may proceed to step S860.

In step S860, the program may generate a balanced output by logically combining a secondary clock and a delayed secondary clock signal. The balanced aspect of the output can be a consequence of a suitably designed secondary clock signal, logical component type, and combining circuit topology. For example, the balanced output clock may be generated by a secondary clock signal that is edge aligned to a master clock, then combined with a delayed secondary clock signal using a logical OR operation, a logical NAND operation, and the like. The balanced output clock signal may advantageously have a 50% duty cycle, but may have a duty cycle between 25% and 75%. The rise and fall times of the balanced output clock signal may advantageously be less than 20%, of the period of the input clock signal.

After step S860, program flow may proceed to step S870 where the program may stop.

It should be appreciated that process 800 may be repeated for multiple instances, each instance generating a balanced output clock that may be an integer or non-integer division of a fundamental clock frequency. Each balanced output clock can have an independent clock frequency. All such balanced output clocks can be phase-aligned to a master clock and can have frequencies that are submultiples of a master or input dock. In other words, a set of balanced output clocks that divide an clock (in the sense that the frequency is divided, i.e., the period is multiplied) by a set of integer or non-integer divisors can all be phase-aligned as a set using the methods of the present disclosure.

Figure 9:
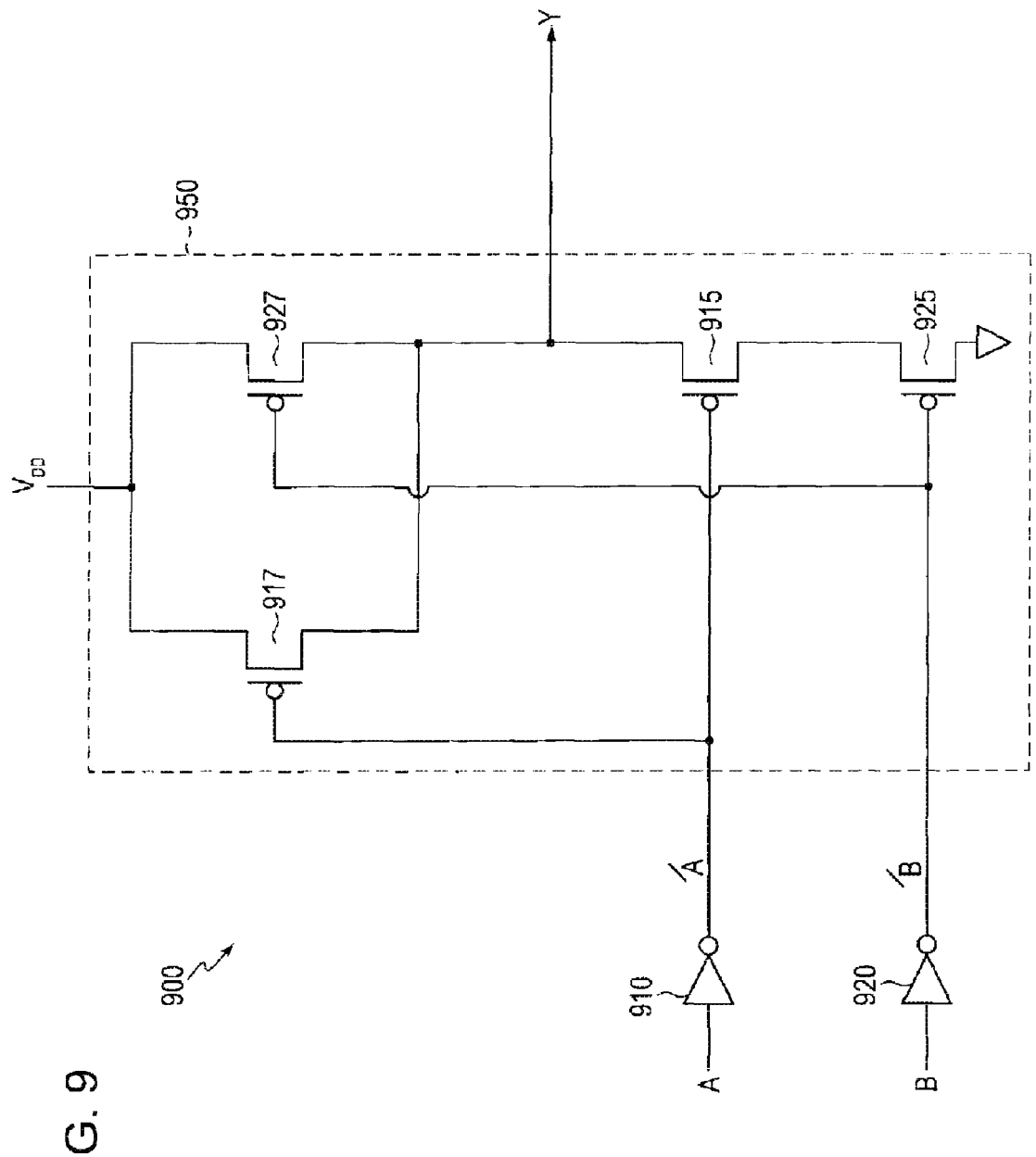
FIG. 9 shows an example of a balanced NAND gate cell that is adapted to functionally operate as an OR gate by the addition of inverters at signal inputs.

FIG. 9 shows an example of a logical OR gate 900 having a pair of inverters, 910 and 920 plus a NAND gate 950. The inverter 910 can accept a signal A and inverter 920 can accept a signal B. Inverters 910 and 920 can produce an inverted signal denoted /A and an inverted signal denoted /B, respectively. It should be understood that circuits for producing inverters are well known in the art.

The NAND gate 950 can be a cell or configuration of transistors that accent the inverted inputs /A and /B and can produce an output Y that given by /(/A& /B), i.e., Y=A+B, where the plus sign indicates a logical OR operation and the / symbol indicates a logical inverse. The two NAND gate cell inputs, /A and /B, can drive the gates of a pair of n-channel metal oxide semiconductor field effect transistors (MOSFETs) 915 and 925, respectively. The /A and /B inputs can also drive the gates of p-channel MOSFETs, 917 and 927, respectively. The p-channel MOSFETs 917 and 927 can be source-coupled to the output of the NAND gate 950, denoted Y. The drain of each of the p-channel MOSFETs 917 and 927 can be connected to a positive power supply. In this example, the source of the n-channel MOSFET 925 which is driven by /B in can be connected to ground and the drain of n-channel MOSFET 925 can be connected to the source of a second n-channel MOSFET 915, which is driven by /A. The drain of the n-channel MOSFET 915 can produce the output Y.

Figure 10A:
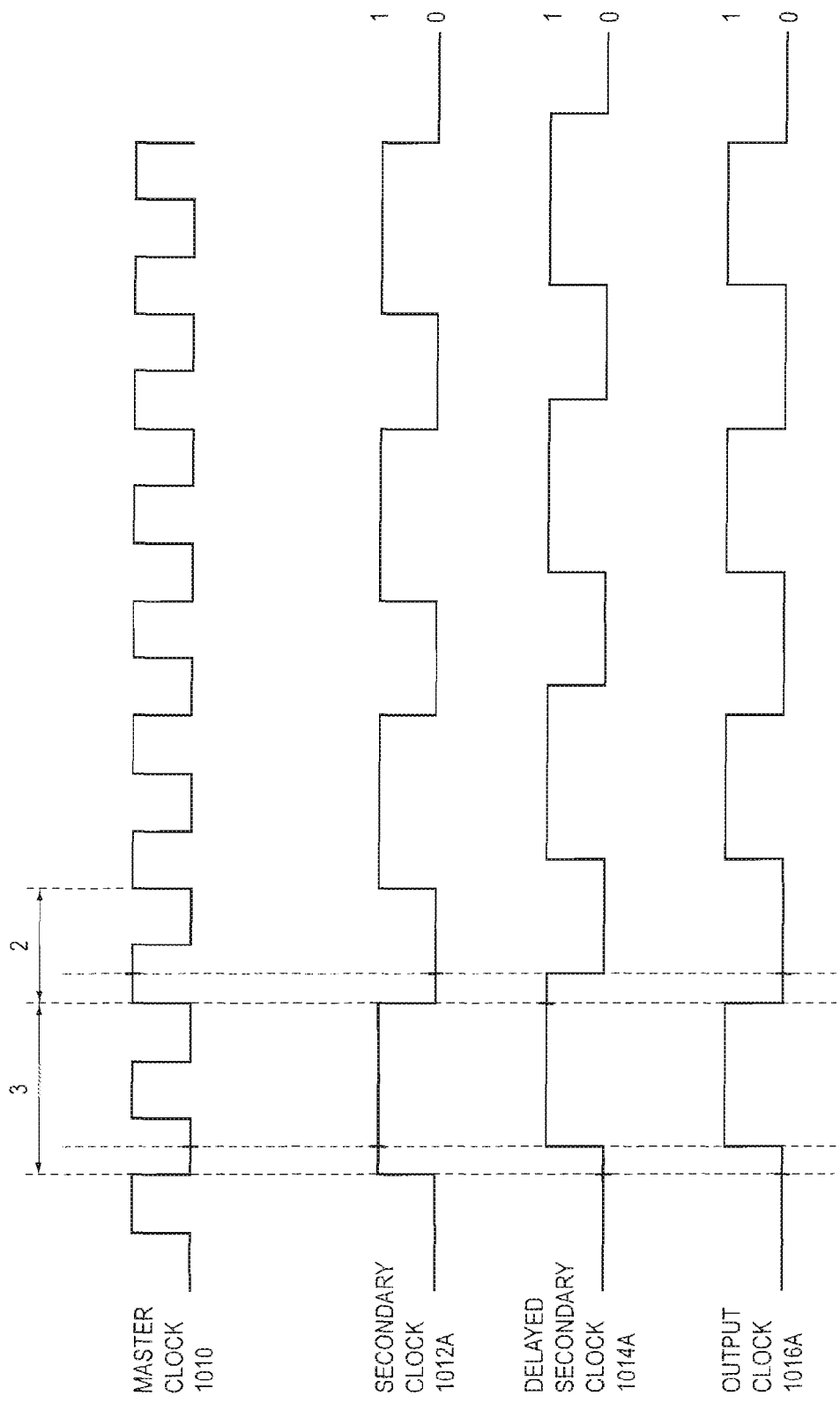
FIG. 10A shows an example of an AND logic implementation of a 1:2.5 clock division.
Figure 10B:
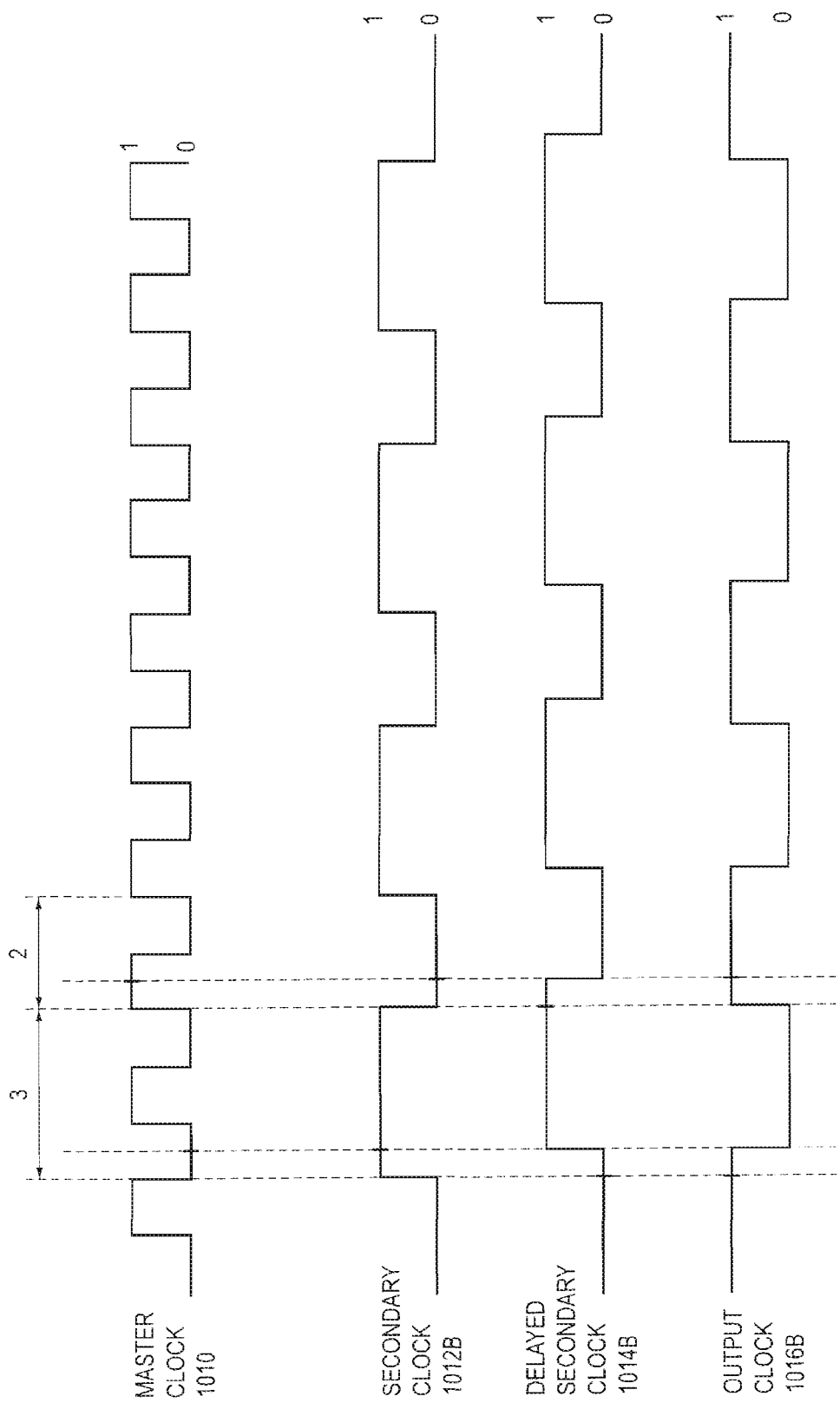
FIG. 10B shows an example of a NAND logic implementation of a 1:2.5 clock division.

The NAND gate 950 can provide a useful embodiment of alternative combinational logic configurations for generating a balanced output from a secondary clock and a delayed secondary clock. For example, FIG. 10A shows an example of an NAND logic implementation of a 1:2.5 clock division of a master clock 1010 using a suitable secondary clock signal 1012A, i.e. a secondary clock signal that is designed to be combined a delayed secondary clock signal 1014A by a NAND gate to produce a non-integer divided output clock 1016A. FIG. 10B shows an example of an AND logic implementation of a 1:2.5 clock division, again with a suitable secondary and delayed secondary clock signal.

Figure 11A:
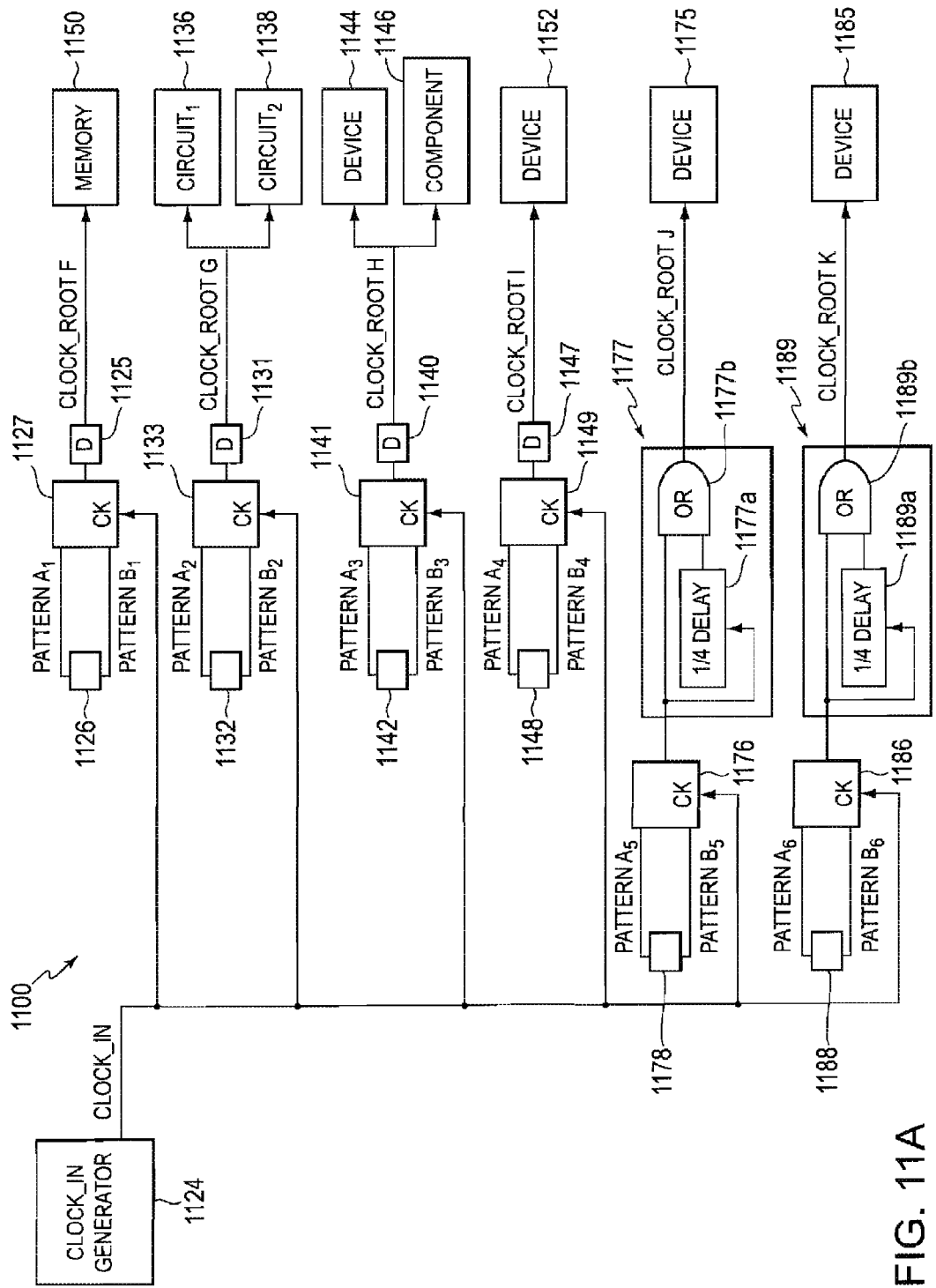
FIG. 11A shows an example of a system on a chip (SOC) that has standard blocks that produce integer and non-integer divisions.

FIG. 11A shows an example of a system on a chip (SOC) 1100 that has standard blocks that produce integer and non-integer divisions. The SOC can include CLOCK_IN generator 1124, pattern generators 1126, 1132, 1142, 1148, 1178 and 1188, pattern selectors 1127, 1133, 1141, 1149, 1176 and 1186, compensatory delays 1125, 1131, 1140, and 1147, delay and balancers 1177 and 1189, memory 1150, circuits 1136 and 1138, devices 1144, 1152, 1175, and 1185, and component 1146. CLOCK_IN generator 1124 can provide a master clock signal to switch or multiplex the pattern selectors 1127, 1133, 1141, 1149, 1176 and 1186 and generate a secondary clock signal, which may be balanced or unbalanced, i.e., which may be used to implement an integer or a non-integer division of the CLOCK_IN generator 1124 signal, respectively.

Figure 11B:
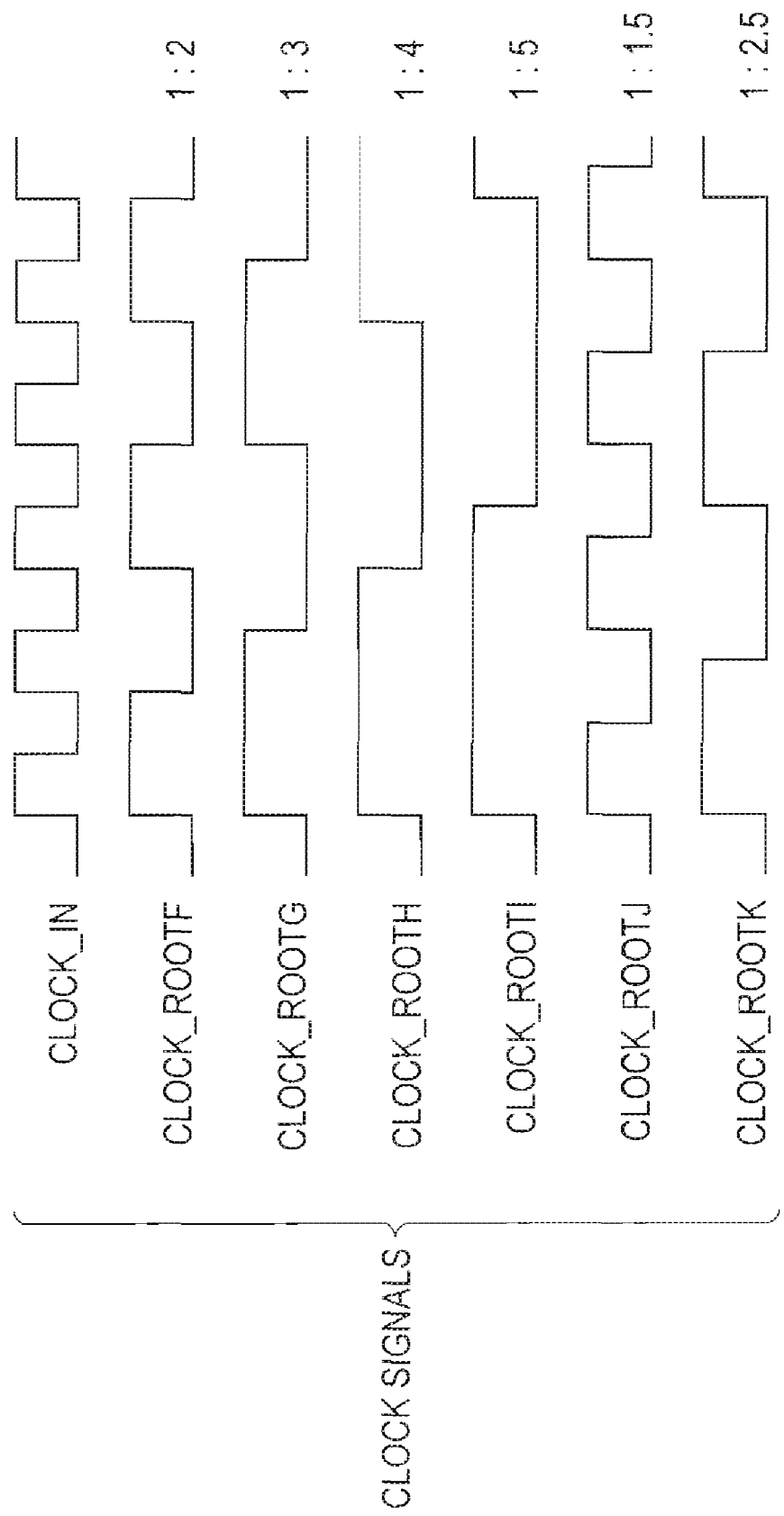
FIG. 11B shows an example of the clock root waveforms of FIG. 11A.

The output of each pattern selector 1127, 1133, 1141, 1149, 1176 and 1186 can be a CLOCK_ROOT signal, denoted F, G, H, I, J, and K, respectively. The time domain representations of the clock root signals of FIG. 11A can be seen in FIG. 11B. The CLOCK_ROOT signals F, G, H, and I can be integer divisions of an input clock signal, e.g., 1:2, 1:3, 1:4, and 1:5, respectively. The CLOCK_ROOT signals J and K can be non-integer divisions of the clock signal, e.g., 1:1.5 and 1:2.5, respectively. Each clock root signal may be so called because it can be regarded as a mathematical root of a phasor rotating in the complex plane.

The delay and balancers 1177 and 1189 may be implemented as a ¼ delay element 1177a and 1189a and OR gates 1177b and 1189b respectively. It is to be understood that the ¼ delay element 1177a or 1189a and/or delay elements within compensatory delays 1125, 1131, 1140, and 1147, may be addressable delay elements or may implement pre-determined, e.g., hard-wired, delays. The compensatory delays 1125, 1131, 1140, and 1147 can be fixed or programmable delays that delay the integer divided clocks to align a rising of falling edge of the integer divided clocks to a corresponding rising or falling edge of a, non-integer divided clock. The compensatory delays 1125, 1131, 1140, and 1147 can align both integer and non-integer divided clocks to less than one quarter of the period of the CLOCK_IN 1124 generator signal. In an advantageous case, all CLOCK_ROOT signals can be aligned with respect to each other such that alignment of any pair of CLOCK_ROOT signals is within one tenth of the period of the CLOCK_IN 1124 generator.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A method of generating an output clock signal comprising:
   generating an input clock signal having an input clock frequency;
   generating a secondary clock signal having transitions between a first state and a second state that is based on the input clock signal and having a frequency that is a non-integer division of the input clock frequency;
   generating a delayed secondary clock signal that corresponds to the secondary clock signal and that has transitions between a first state and a second state that are time delayed relative to the secondary clock signal; and
   generating the output clock signal that is a logical combination of the secondary clock signal and the delayed secondary clock signal and that has a frequency that is a non-integer division of the input clock frequency.

2. The method of claim 1, wherein the input clock signal has 50% duty cycle.

3. The method of claim 1, wherein the secondary clock signal has a 2/3 duty cycle.

4. The method of claim 1, wherein the delayed secondary clock signal has a composition that is identical to the secondary clock signal, but that is delayed by a fraction of a reciprocal of the input clock frequency.

5. The method of claim 4, wherein the fraction is ¼.

6. The method of claim 1, further comprising:
   measuring the frequency of the input clock; and
   estimating a period of the input clock from the measured frequency.

7. The method of claim 6, further comprising
   delaying the delayed secondary clock based on the period.

8. The method of claim 7, wherein logically combining further comprises:
   at least one of logically ORing, ANDing, and NANDing the secondary clock signal and the delayed secondary clock signal.

9. The method of claim 8, wherein the output clock signal has a 50% duty cycle.

10. The method of claim 1, wherein the input clock signal is provided by a system phase-locked loop.

11. An apparatus comprising:
    an input clock signal synthesizer configured to generate an input clock signal having an input clock frequency;
    a secondary clock signal synthesizer configured to generate a secondary clock signal that is based on the input clock signal, wherein the secondary clock signal has a frequency that is a non-integer division of the input clock frequency;
    a shift actuator configured to generate a delayed secondary clock signal that is time-shifted relative to the secondary clock signal;
    a balancer configured to generate a balanced output clock signal that is a logical combination of the secondary clock signal and the delayed secondary clock signal, and that has a frequency that is a non-integer division of the input clock frequency.

12. The apparatus of claim 11, further comprising:
    a device having a clock input to receive the balanced output clock signal.

13. The apparatus of claim 12, wherein the input clock signal has 50% duty cycle.

14. The apparatus of claim 12, wherein the secondary clock signal has a 2/3 duty cycle.

15. The apparatus of claim 12, wherein the delayed secondary clock signal has a composition that is identical to the secondary clock signal, but that is delayed by a fraction of a reciprocal of the input clock frequency.

16. The apparatus of claim 15, wherein the fraction is ¼.

17. The apparatus of claim 12, further comprising:
measuring the frequency of the input clock; and
estimating a period of the input clock from the measured frequency.

18. The apparatus of claim 17, further comprising
delaying the delayed secondary clock based on the period.

19. The apparatus of claim 18, wherein logically combining further comprises:
at least one of logically ORing, ANDing, and NANDing the secondary clock signal and the delayed secondary clock signal.

20. The apparatus of claim 19, wherein the output clock signal has a 50% duty cycle.

21. The apparatus of claim 11, wherein the input clock signal is provided by a system phase-locked loop.

* * * * *